United States Patent [19]

Ovshinsky et al.

[11] Patent Number: 5,231,047

[45] Date of Patent: Jul. 27, 1993

[54] HIGH QUALITY PHOTOVOLTAIC SEMICONDUCTOR MATERIAL AND LASER ABLATION METHOD OF FABRICATION SAME

[75] Inventors: Stanford R. Ovshinsky, Bloomfield Hills; Xunming Deng, Farmington; Rosa Young, Troy, all of Mich.

[73] Assignee: Energy Conversion Devices, Inc., Troy, Mich.

[21] Appl. No.: 811,159

[22] Filed: Dec. 19, 1991

[51] Int. Cl.[5] ............................................. H01L 21/20
[52] U.S. Cl. .................................... 437/101; 437/173; 148/DIG. 3; 427/572; 427/586
[58] Field of Search ............. 148/DIG. 153, DIG. 92, 148/DIG. 93, DIG. 1; 427/53.1, 74; 136/258; 437/2, 3, 101, 173, 945

[56] References Cited

FOREIGN PATENT DOCUMENTS 280898 7/1990 Fed. Rep. of Germany .
57-162416 10/1982 Japan .
58-10817 1/1983 Japan .
60-090342 5/1985 Japan .

OTHER PUBLICATIONS

Brodsky, M., et al, "Doping of Sputtered Amorphors Semiconductors", IBM Tech. Disc. Bull., vol. 19, No. 12, May 1977 p. 4802.
Murase, K., et al, "Silicon–Germanium–Boron Ternary Alloy", Jap. Journal of Appl. Phys., vol. 21, No. 4, Apr. 1982, pp. 560–566.

Primary Examiner—George Fourson
Attorney, Agent, or Firm—Marvin Siskind; Marc Luddy; David Schumaker

[57] ABSTRACT

A high quality, narrow band gap, hydrogenated amorphous germanium or amorphous silicon alloy material characterized by a host matrix in which all hydrogen is incorporated therein in germanium monohydride or silicon monohydride form, respectively; their mobility-lifetime product for non-equilibrium charge carriers is about $10^{-8}$ and about $10^{-7}$, respectively; their density of defect states in the band gap thereof is less than about $1 \times 10^{17}$ and about $2 \times 10^{16}/cm^3$, respectively; and their band gap is about 1.5 and about 0.9 eV, respectively. There is also disclosed a structure formed from a plurality of very thin layer pairs of hydrogenated amorphous germanium and amorphous silicon alloy material, each layer pair of which cooperates to provide narrow band gap material. From about 3 to about 7 atomic percent fluorine is added to the germanium and/or silicon alloy material so as to provide a strong bond (as compared to hydrogen) so as to provide reduced sensitivity to Stabler/Wronski degradation. The preferred method of fabricating such improved narrow band gap materials is through a laser ablation process in which hydrogen or fluorine gas is introduced for incorporation into the germanium or silicon host matrix, thereby eliminating the reliance on the zoo of precursor species present in r.f. or microwave plasma process.

60 Claims, 5 Drawing Sheets

HIGH QUALITY PHOTOVOLTAIC SEMICONDUCTOR MATERIAL AND LASER ABLATION METHOD OF FABRICATION SAME

FIELD OF THE INVENTION

This invention relates generally to amorphous germanium and silicon alloy materials and more particularly to a laser ablation method of producing high quality hydrogenated amorphous germanium and silicon alloy materials which are characterized by the substantial absence of germanium hydrides and/or silicon hydrides, other than the monohydrides thereof. These high quality materials are characterized by mobility-lifetime (mu-tau) products and defect densities equivalent to or less than hydrogenated amorphous silicon/germanium alloy materials produced by glow discharge.

BACKGROUND OF THE INVENTION

Disclosed herein is a method of producing hydrogenated amorphous semiconductor materials which are characterized by a low density of defect states in the energy gaps thereof and good electrical, optical and microstructural properties. As used herein, "density of defect states" is defined as the number of defect states, or deep electronic trap sites such as dangling, broken or non-optimally coordinated bonds per unit volume in the band gap of a given material.

Amorphous semiconductor alloy material, such as amorphous silicon alloy material and amorphous germanium alloy material, have previously been produced by glow discharge plasma deposition, chemical vapor deposition, evaporation and sputtering processes. While these processes will be referred to in greater detail hereinafter, it is sufficient for purposes of the instant discussion to note that the amorphous semiconductor alloy materials so produced have possessed a relatively high density of defect states in the energy gaps thereof. Since a significant industrial use of amorphous silicon and germanium alloy materials is in the production of semiconductor devices such as photovoltaic cells, it is important that the alloys used to fabricate the photovoltaic cells provide, inter alia, good electrical transport properties. However, amorphous alloy materials having a high density of defect states in the energy gaps thereof are characterized by a large number of deep electronic trap sites which result in low drift mobility and short lifetimes for the recombination of free carriers, particularly minority carriers. Amorphous semiconductor materials are extremely attractive alternatives to crystalline semiconductors because they (1) can produce as large area devices, and (2) possess a direct band gap with a high optical absorption coefficient as compared to the indirect band gap and low optical absorption of corresponding crystalline materials. It is therefore extremely important for the density of defect states in the band gap of amorphous semiconductor alloy material to be reduced in order for amorphous semiconductors to compete in a cost effective manner with their crystalline counterparts.

Whereas it is now possible to provide the wider band gap amorphous semiconductor material with an acceptably low, although not optimum, density of defect states, it is the narrow band gap material (about 1.4 eV and below) which have yet to be produced with a sufficiently low density of defect states to make more than 13.7% efficient photovoltaic cells. It is believed the reason better narrow band gap materials have not as yet been produced is because (1) the environment in which these low band gap amorphous semiconductor alloy materials have been deposited included a great variety of unwanted species, and (2) the previous methods of combining the precursor materials did not effectively optimize tetrahedral coordination of the deposited material. The numerous species produced by, as well as the parameters involved with, plasma deposition, evaporation, sputtering etc. are inherently uncontrollable, and therefore these processes are unable to provide the extremely high efficiency photovoltaic cells which are theoretically possible.

Since the lowest energy state of amorphous solids such as silicon and germanium occurs if those solids recombine in crystalline form, the aforementioned methods of depositing amorphous semiconductor alloy material resulted in the deposition of a low density, porous amorphous material that contained a great number of bonding vacancies and micro voids. In order to further improve amorphous semiconductor alloy material, it is therefore necessary to modify known methods of deposition so as to either (1) reduce the number of those vacancies and voids, or (2) make these vacancies and voids become a helpful part of the process. Only by improving the number of vacancies and voids can a high density, low defect density material characterized by good transport properties be produced.

Before proceeding further, note that amorphicity is a generic term referring only to a lack of long range periodicity. In order to understand amorphous semiconductor materials, the stoichiometry of the material, the type of chemical bonding, the number of bonds generated by the local order (its coordination), and the influence of the entire local environment upon the resulting bonding configurations incorporated in the amorphous solid must be considered. Amorphous semiconductor materials, rather than being viewed as a random packing of atoms characterized as hard spheres, should be though of as composed of an interactive matrix influenced by electronic configurations and interactions. If, however, one is able to outwit the normal relaxations of the depositing amorphous semiconductor alloy material and utilize the available three-dimensional freedom present in the amorphous state, entirely new and significantly improved amorphous materials may be fabricated. Of course, this creation of new amorphous semiconductor material requires the use of new processing techniques.

The inescapable conclusion to be derived from the foregoing is that by properly coordinating process parameters, it should be possible to create deviant, but desirable, electronic configurations in amorphous semiconductor materials. In order to understand this concept, it must be realized that amorphous materials have several different bonding configurations as available energetic options. For instance, elemental amorphous silicon, although normally tetrahedrally coordinated, has some atoms which are not tetrahedrally bound. Local order is always specific and coexists in several configurations. Stearic and isomeric considerations are involved both with factors influencing amorphicity and with those creating defects in the materials. The constraints in amorphous semiconductor materials are involved with asymmetrical, spatial and energetic relationships of atoms permitted by the varying three dimensional chemical and geometrical possibilities afforded by an amorphous solid. In such a solid there is not only a spectrum of bonding configurations which spans from metallic to ionic, but a spectrum of bonding strengths. A major factor involved in the spectrum of bond strengths is the competitive force of the chemical environment which acts to influence and alter the bond energy. Based on the foregoing, it should be apparent that a greater number of weaker bonds are presented in an amorphous semiconductor material than in its crystalline counterpart.

There exists an important energetic process that leads a material toward amorphicity. More specifically, the preferred chemical bonding configurations of atoms and the field produced by non-bonding electrons can provide the molecular structure with a proclivity toward assuming a more ordered noncrystalline state. The geometries or shapes of these structures are complex, distorted ones formed by localized pressures, repulsions and attractions of surrounding forces. These forces cause compression in one area, elongation in a second, twisting in a third, all in contradistinction to a perfectly repetitive crystalline cell. It can therefore be appreciated that the energetic considerations necessary to complete four-fold coordination depend upon the ability to spatially and energetically mate bonding positions. This is the reason that amorphous silicon (being tetrahedrally coordinated) has a greater number of dangling bonds, weakened bonds and voids than its crystalline counterparts.

In amorphous semiconductor alloy material the normal equilibrium bonding can be disturbed by creating new bonding configurations through the addition of a compensating element or elements with multi-orbital possibilities. For instance, alloying permits the optical band gap to be tailored for specific applications and yet permits chemical modification or doping by reducing defect states in the gap, thereby affecting electrical conduction. The elimination of the crystalline constraints permits a greater variety of bonding and antibonding orbital relationships than are present in a crystalline solid and represents a key element in the synthesis of improved amorphous semiconductor alloy materials.

In summation, the charge carrier transport properties of amorphous semiconductor alloy materials are directly related to deviant bonding configurations due to under or over coordination. It is the chemistry and microstructure existing in amorphous semiconductor materials that permits the utilization of the "super halogenicity" of fluorine for its ability to organize and expand coordination which provides for the design of atomic and molecular configurations best suited for specific purposes.

In other words, it is possible to synthesize and independently control all relevant characteristics of amorphous semiconductor alloy material such as optical band gap, electrical activation energy, melting temperature, hopping conduction, and even thermal conductivity. However, this presupposes that the proper manufacturing techniques are employed. The implementation of proper manufacturing techniques requires a departure from convention. It is just such novel processing technology for synthesizing improved amorphous semiconductor material with optimum characteristics to which one aspect of the instant application is directed.

In contrast to indirect gap crystalline silicon, amorphous silicon alloy materials are a direct gap semiconductor and, therefore, only a material thickness of one micron or less is necessary to absorb the same amount of sunlight as 50 micron thick crystalline silicon. Further, amorphous semiconductor alloy material can be made faster, easier and in larger areas than can crystal silicon alloys, thereby reducing assembly time and cost. While a considerable effort has been made to develop processes for readily depositing amorphous semiconductor alloys or films, each of which can encompass relatively large areas, limited only by the size of the deposition equipment, and which can be readily doped to form p-type and n-type materials where p-n junction devices are to be made therefrom equivalent to those produced by their crystalline counterparts. For many years such work was substantially unproductive. Amorphous silicon or germanium (Group IV) films are normally four-fold coordinated and were found to have microvoids and dangling bonds and other defects which produce a high density of localized states in the energy gap thereof. The presence of a high density of localized states in the energy gap of amorphous semiconductor films results in a low degree of photoconductivity and short carrier lifetime, making such films unsuitable for photoresponsive applications. Additionally, such films cannot be successfully doped or otherwise modified to shift the Fermi level close to the conduction or valence bands, making them unsuitable for making p-n junctions for solar cell and current control device applications.

To date, the reduction of the localized states was accomplished by glow discharge deposition of amorphous silicon alloy films wherein a gas of silane ($SiH_4$) is passed through a reaction tube for decomposition by an r.f. glow discharge and deposition onto a substrate at a substrate temperature of about 250° C. The material so deposited on the substrate is an intrinsic material consisting of silicon and hydrogen. To produce a doped amorphous material, a gas of phosphine ($PH_3$) for n-type conduction or a gas of diborane ($B_2H_6$) for p-type conduction is premixed with the silane gas and passed through the glow discharge reaction chamber under the same operating conditions. The gaseous concentration of the dopants used was between about $5 \times 10^{-6}$ and $10^{-2}$ parts per volume.

D. I. Jones, W. E. Spear, P. G. LeComber, S. Li, and R. Martins worked on preparing a-Ge:H from $GeH_4$ using similar glow discharge plasma deposition techniques. However, the material obtained gave evidence of a high density of localized states in the energy gap thereof. Although the material could be doped, the efficiency was substantially reduced from that obtainable with a-Si:H. In this work reported in Philosophical Magazine B, Vol. 39, p. 147 (1979) the authors conclude that because of the large density of gap states the material obtained is ". . . a less attractive material than a-Si for doping experiments and possible applications." Further work by Li et al. on a-Ge:H by glow discharge plasma deposition reported in Materials Research Society Symposium Proceedings, Volume 149, pages 187–192 (1989) additionally showed that glow discharge amorphous germanium is susceptible to atmospheric contamination, especially at low substrate deposition temperatures.

Research has also been conducted to evaluate the sputter deposition of amorphous silicon alloy films in an atmosphere of argon (required by the sputtering deposition process) and molecular hydrogen, to determine the results of such molecular hydrogen on the characteristics of the deposited amorphous silicon alloy film. This research indicated that the molecular hydrogen indeed acted as an altering agent which bonded in such a way as to reduce the density of localized defect states in the energy gap. However, the reduction of states achieved by the sputter deposition process was much less than achieved by the RFCVD process described above. P and n dopant gases also were introduced in the sputtering process to produce p and n doped materials. The resultant materials possessed a lower doping efficiency than the materials produced in the n.f. glow discharge process. However, neither the RFCVD nor the sputtering deposition techniques of depositing amorphous semiconductor layers provided n-doped and p-doped materials with sufficiently high acceptor concentration to produce commercial p-n or p-i-n junction devices. While the n-doping efficiency was below acceptable commercial levels, the p-doping efficiency was particularly unacceptable since the width of the band gap was reduced and the number of localized states in the band gap was increased.

Further research was conducted in an attempt to additionally reduce defect states in amorphous silicon alloy materials or in amorphous silicon:hydrogen alloy material. Fluorine was found to readily diffuse into and bond to the amorphous silicon alloy material, substantially reducing the density of localized states therein, because of its electro-negativity and the small size of the fluorine atoms which enables them to be readily introduced into the amorphous silicon host matrix. Fluorine was found to bond to the dangling bonds of the silicon in a manner which is more stable and efficient than is possible when hydrogen is used. However, fluorine introduced into amorphous germanium alloy material or amorphous germanium:hydrogen alloy material, has not, up to the date of the instant invention, produced a narrow band gap material with as low a density of defect states as amorphous silicon alloy material.

Numerous attempts have been made to construct both natural and synthetic crystalline analog materials by special layering techniques with the aim of extending the range of desirable properties which were heretofore limited by the availability of natural crystalline materials. One such attempt involved compositional modulation by molecular beam epitaxy (MBE) deposition on single crystal substrates. Esaki, Ludeke and Tsu, in U.S. Pat. No. 3,626,257, describe the fabrication of monolayer semiconductors by one MBE technique. These modulated prior art structures are typically called "superlattices". Superlattice fabrication techniques are based on the concept that discrete layers may be made to form a one-dimensional periodic potential by periodic variation of (1) alloy composition or (2) impurity density. Typically, the largest period in these superlattices is on the order of a few hundred Angstroms, however, monatomic layered superlattice structures have also been constructed. The superlattices can be characterized by (1) several layers of a material "A" (such as GaAs), followed by (2) several layers of a material "B" (such as AlAs), in a repetitive manner, (3) formed on a single crystal substrate. The optimum superlattice is a single crystal synthetic material with good crystalline quality and electron mean free paths greater than the period. Conventional superlattice concepts have been utilized for special electronic and optical effects; however, because the lattice constants must be very carefully matched, the utilization of these superlattices has been limited.

In related work, Dingle, et al., see U.S. Pat. No. 4,261,771, disclose quasi-superlattices and non-superlattice structures. The former are comprised of epitaxially grown crystalline islands of a foreign material in an otherwise homogeneous layered background material. The latter, non-superlattice structures, are an extension of quasi-superlattice materials in that the islands are grown into columns which extend vertically through the homogeneous layered background material.

In addition to MBE superlattice construction techniques, other researchers have developed layered synthetic microstructures which utilize different forms of vapor deposition, including diode sputtering, magnetron sputtering and standard multisource evaporation and organo-metallic vapor deposition. These materials can be thought of as synthetic crystals or crystal analogues in which the long range periodicity, the repetition of a particular combination of layers, or the grading of layer spacing must be closely maintained. Consequently, superlattice structures, so constructed, are both structurally and chemically homogeneous in the x-y plane, but periodic in the z direction.

In addition to the synthetic material-producing techniques described above, compositionally varied materials and processes for their production are disclosed in copending U.S. Pat. No. 4,520,039 to Stanford R. Ovshinsky, assigned to the assignee of the instant application and the disclosure of which is incorporated herein by reference.

Other methods of producing amorphous semiconductor alloy materials, specially adapted for photovoltaic applications, are disclosed in Assignee's U.S. Pat. Nos. 4,217,374; 4,226,898 and 4,342,044, the disclosures of which are also incorporated hereinto by reference. The deposition techniques described therein are adapted to produce materials including germanium, tin, fluorine and hydrogen as well as silicon. The materials are produced by vapor and plasma activated deposition processes. Further, tandem multiple photovoltaic cell structures are disclosed in U.S. Pat. Nos. 4,891,074 and 4,954,182 assigned to the assignee of the instant application and hereby incorporated by reference.

U.S. Pat. No. 4,569,697 (assigned to the assignee of the instant invention and the disclosure of which is incorporated by reference) is directed to a post deposition diffusion process in which unadulterated amorphous semiconductor material was deposited onto a substrate at a low substrate temperature before the, preferably activated, density of states reducing element was introduced into an ultrahigh vacuum environment. Since (1) an environment was provided in which there were no contaminants present to occupy the available bonding sites of the amorphous semiconductor alloy material, and (2) the deposition occurred at a low temperature, the deposited amorphous semiconductor alloy material was a porous mass of voids, vacancies, dangling bonds, etc. Therefore, the density of states reducing element readily diffused into and was greedily accepted by the deposited material and served to reduce the density of defect states in those regions of the heterogeneous amorphous alloy characterized by a relatively low density of defect states. An annealing step completed the diffusion of the density of states reducing element through the deposited material and served to reduce the density of defect states in those regions of the heterogeneous amorphous alloy characterized by a relatively high density of defect states. Finally, a strain relieving element was introduced to relax bonding stresses in the resultant alloy and ion implantation was employed to reduce the density of defect states in regions of the alloy which were unaccessible to the diffusion process.

Another method which has been used to produce amorphous semiconductor materials is laser ablation. Laser ablation essentially consists of striking a target of the desired semiconductor material with a laser beam to evaporate material therefrom. The evaporated material is deposited onto a substrate which is disposed adjacent to the target. In the past, laser ablation has been used as a laboratory curiosity to fabricate amorphous silicon, amorphous germanium, and hydrogenated amorphous silicon alloy material. For further information on laser ablation deposition processes in general see Sankur, et al "Formation of Dielectric and Semiconductor Thin Films by Laser-Assisted Evaporation", *Applied Physics A*, Vol. 47, pages 271–84, 1988, the disclosure of which is incorporated herein by reference.

The laser ablation of a-Si and a-Si:H are disclosed by Hanabusa, et al in "Dynamics of laser-induced vaporization for ultrafast deposition of amorphous silicon films", *Applied Physics Letters*, Vol. 38, pages 385-7, March 1981 and "Reactive laser-evaporation for hydrogenated amorphous silicon", *Applied Physics Letters*, Vol. 39, pages 431-2, September 1981, the disclosure of each is incorporated herein by reference. In the former, the production of a-Si is disclosed; however, the material is not of high enough quality for use in photovoltaics due to the lack of hydrogen present in the host matrix thereof. The material produced by the latter publication does include hydrogen therein; however, the majority of the incorporated hydrogen is in the dihydride form and therefore the microstructural and photoelectrical properties are poor.

Production of a-Ge by laser ablation is disclosed by Sankur, et al in "High-quality optical and epitaxial Ge films formed by laser evaporation", *Journal of Applied Physics*, Vol. 65, pages 2475-8, March 1989 and by Afonso, et al in "Good-quality Ge films grown by excimer laser deposition", *Applied Surface Science*, Vol. 46, pages 249–53, 1990, the disclosure of each of which is incorporated herein by reference. However, as with the a-Si films described above, the materials produced by these disclosed methods are not of photovoltaic quality due, inter alia, to the absence of hydrogen compensation.

There still exists a long felt need for a high quality narrow band gap material to make full use of the infrared (IR) part of the solar spectrum in photovoltaic applications. Glow discharge deposited a-SiGe$_x$:H alloy has been used for the bottom cell of tandem or triple junction solar cells, to absorb the IR light from the sun. The optoelectronic properties of glow discharge a-SiGe$_x$:H, however, degrade rapidly once its band-gap is decreased below 1.4 eV. It is believed that in a-SiGe$_x$:H film, H does not bond favorably to Ge (is not fully coordinated) and therefore, for narrower band gap alloy material, i.e., more Ge content, the material possesses an increased number of uncompensated defects.

SUMMARY OF THE INVENTION

In light of the foregoing, it is a first object of the present invention to provide a laser ablation deposition method of forming high quality hydrogenated amorphous germanium alloy material, said material characterized by (a) the substantial absence of germanium hydrides, other than the monohydride, (b) a mobility-lifetime product for nonequilibrium charge carriers therein of about $10^{-8}$ cm$^2$/V, and (c) a density of defect states in the host matrix thereof of about $1\times10^{17}$/cm$^3$. The method includes the steps of providing a deposition chamber, providing a substrate in the deposition chamber and positioning at least one target of germanium-including material adjacent said substrate and providing a laser. The deposition chamber is evacuated and a background gas, including a partial pressure of at least hydrogen, is introduced into the evacuated deposition chamber. Germanium from the target and hydrogen from the partial pressure are deposited, by laser ablation, onto the substrate, thereby forming on the substrate a layer of hydrogenated germanium alloy material having an amorphous microstructure, said material characterized by the substantial absence of incorporated germanium hydrides, other than the monohydride, having a mobility-lifetime product for nonequilibrium charge carriers therein of greater than about $10^{-8}$ cm$^2$/V, and having a density of defect states in the band gap of the host matrix thereof of less than about $1\times10^{17}$/cm$^3$.

A second object of the present invention to provide a laser ablation deposition method of forming high quality hydrogenated amorphous silicon alloy material, said material characterized by (a) the substantial absence of silicon hydrides, other than the monohydride, (b) a mobility-lifetime product for nonequilibrium charge carriers therein of about $10^{-7}$ cm$^2$/V, and (c) a density of defect states in the host matrix thereof of about $2\times10^{16}$ per cm$^3$. The method includes the steps of providing a deposition chamber, providing a substrate in the deposition chamber, and positioning at least one target of silicon-including material adjacent said substrate and providing a laser. The deposition chamber is evacuated and a background gas, including a partial pressure of at least hydrogen, is introduced into the evacuated deposition chamber. Silicon from the target and hydrogen from the partial pressure are deposited, by laser ablation, onto the substrate, thereby forming on the substrate a layer of hydrogenated silicon alloy material having an amorphous microstructure, said material characterized by the substantial absence of incorporated silicon hydrides, other than the monohydride, having a mobility-lifetime product for nonequilibrium charge carriers therein of greater than about $10^{-7}$ cm$^2$/V, and having a density of defect states in the band gap of the host matrix thereof of less than about $5\times^{16}$ per cm$^3$.

A third object of the present invention to provide a laser ablation deposition method of forming a high quality, multi-layered structure of hydrogenated amorphous germanium and hydrogenated amorphous silicon alloy materials, said structure defined by a plurality of layer pairs, each germanium and silicon layer of said layer pair characterized by (a) the substantial absence of germanium hydrides and silicon hydrides, other than the monohydrides, respectively, (b) a mobility-lifetime product for nonequilibrium charge carriers therein of greater than about $10^{-8}$ and about $10^{-7}$ cm$^2$/V, respectively, and (c) a density of defect states in the host matrix thereof of about $1\times10^{17}$/cm$^3$ and about $2\times10^{16}$/cm$^3$, respectively. The method includes the steps of providing a deposition chamber, providing a substrate in the deposition chamber, and positioning at least one target adjacent said substrate, the target including silicon and or germanium, and providing a laser. The deposition chamber is evacuated and a background gas, including a partial pressure of at least hydrogen, is introduced into the evacuated deposition chamber. Silicon and germanium from the target along with hydrogen from the partial pressure are successively deposited, by laser ablation, onto the substrate, thereby forming on the substrate a plurality of layer pairs of hydrogenated amorphous germanium and hydrogenated amorphous silicon alloy materials, each layer of said layer pair being about 5-30 Å thick, each germanium and silicon layer of said layer pair characterized by the substantial absence of germanium hydrides and silicon hydrides, other than the monohydrides, respectively, a mobility-lifetime product for nonequilibrium charge carriers therein of greater than about $10^{-8}$ and $10^{-7}$ cm$^2$/V, respectively, and a density of defect states in the host matrix thereof of about $1 \times 10^{17}$/cm$^3$ and $2 \times 10^{16}$/cm$^3$, respectively.

A fourth object of the present invention is to produce a high quality, narrow band gap, hydrogenated amorphous germanium alloy material, including at least germanium and hydrogen. This material is characterized by a host matrix in which substantially no germanium hydrides, other than the monohydride are incorporated, the material further having a mobility-lifetime product for nonequilibrium charge carriers therein of greater than about $10^{31\,8}$ cm$^2$/V, and a density of defect states in the band gap of the host matrix thereof of less than $1 \times 10^{17}$/cm$^3$.

A fifth object of the present invention is to produce a high quality, hydrogenated amorphous silicon alloy material having a host matrix which includes at least silicon and hydrogen. The host matrix is characterized by the substantial absence of incorporated silicon hydrides, other than the monohydride, the material further having a mobility-lifetime product for nonequilibrium charge carriers therein of greater than about $10^{-7}$ cm$^2$/V, and a density of defect states in the band gap of the host matrix thereof of less than $2 \times 10^{16}$/cm$^3$.

A sixth and final object of the present invention is to produce a multi-layered narrow band gap structure which is formed of alternating layer pairs of high quality, narrow band gap, hydrogenated amorphous germanium alloy material and high quality hydrogenated amorphous silicon alloy material. Each germanium and silicon layer of the layer pairs are about 5 to about 30 Å thick and include a host matrix characterized by (a) the substantial absence of germanium hydrides and silicon hydrides, other than the monohydrides, respectively, (b) a mobility-lifetime product for nonequilibrium charge carriers therein of greater than about $10^{-8}$ and about $10^{-7}$ cm$^2$/V, respectively, and (c) a density of defect states in the host matrix thereof of about $1 \times 10^{17}$/cm$^3$ and about $2 \times 10^{16}$/cm$^3$, respectively.

Other aspects, objects, features and advantages of the present invention will become apparent from the subsequent detailed description and the appended claims, taken in conjunction with the accompanying drawings.

DETAILED DESCRIPTION OF THE INVENTION

The instant application discloses a laser ablation deposition method for the fabrication of photovoltaic quality hydrogenated amorphous germanium alloy material (a-Ge:H), hydrogenated amorphous silicon alloy material (a-Si:H), hydrogenated amorphous silicon-germanium alloy material (a-SiGe$_x$:H), and layered hydrogenated amorphous semiconductor material which has a structure composed of layer pairs of a-Ge:H and a-Si:H. In this deposition process, a high energy pulsed UV excimer laser beam irradiates a rotating crystalline germanium and/or silicon target in a chamber filled with at least hydrogen and preferably also including fluorine. The laser energy density on the target is chosen carefully so that atoms of germanium and/or silicon are ablated therefrom and then combine with the photo-dissociated background gas, producing a thin film on the adjacent substrates. The amorphous semiconductor materials produced by this method have smooth surfaces and shows no microstructure when analyzed by TEM. The IR absorption spectra of laser deposited a-Ge:H samples show clear germanium monohydride stretching and bending modes. Samples made by laser deposition (LD samples) at room temperature show only a monohydride mode in IR spectra while glow discharge a-Ge:H (GD a-Ge:H) deposited at room temperature show a large fraction of the undesired germanium dihdydride bonds. The band gap of a-Ge:H fabricated by laser deposition is surprisingly low, about 0.91 eV. For LD a-Ge:H, the electrical conductivity, activation energies and prefactors follow a Meyer-Neldel rule. Samples made at substrate temperatures between about 150° and about 250° C. show the largest activation energy (0.49 eV) and lowest room temperature conductivity ($10^{-5}\Omega^{-1}cm^{-1}$). The mobility-lifetime product ($\eta\mu\tau$) is up to about $10^{-8} cm^2/V$ for a-Ge:H samples and about $10^{-7} cm^2/V$ for a-Si:H samples. The density of defect states in the band gap for the laser ablation deposited samples is about equivalent to that of the best glow discharge samples (i.e. about $1\times10^{17}/cm^3$ for a-Ge:H and about $2\times10^{16}/cm^3$ for a-Si:H).

Figure 1:
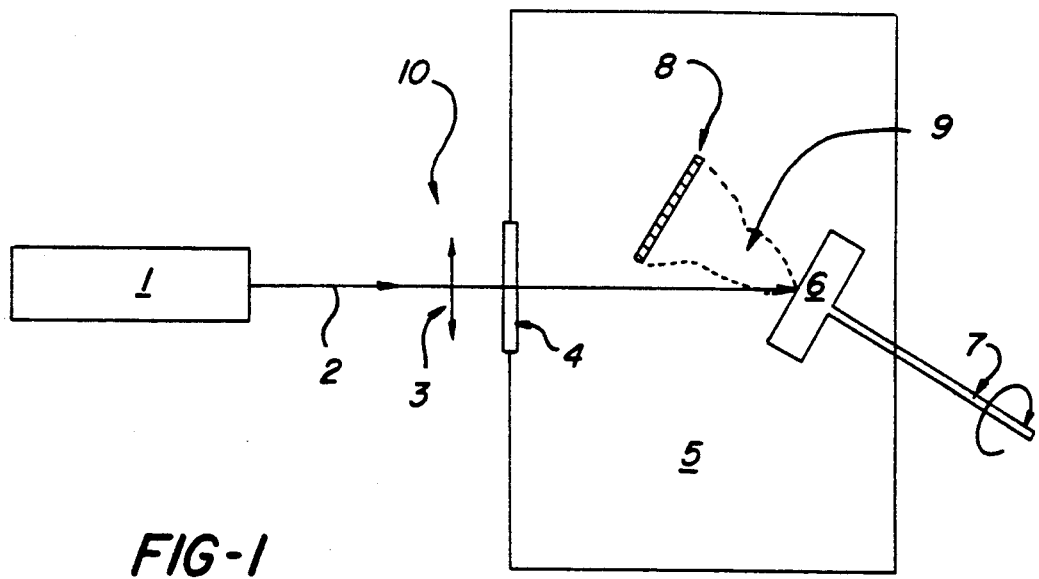
FIG. 1 is a schematic representation of the laser ablation deposition system employed in the method of the instant invention.

FIG. 1 is a schematic depiction of a top plan view of a laser ablation deposition apparatus 10 employed in the fabrication method of the instant invention. An excimer laser 1 generates pulsed UV light 2 at $\lambda=248$ nm with a pulse energy of about 700 mJ and a pulse width of about 30 ns. This laser light passes through a focusing lens 3 and a quartz window 4 in the vacuum deposition chamber 5 and strikes a germanium and/or silicon target 6 operatively disposed inside the evacuated chamber 5. The target 6 is rotatably mounted on an axle 7. During deposition, the target 6 is rotated and the focusing lens 3 is continuously adjusted so that substantially homogeneous ablation of the target surface is accomplished. The laser energy output and the position of the focusing lens 3 are adjusted to obtain the appropriate energy density at the target surface. The area of the focused spot is about 5 mm² and the energy density used for a-Ge:H deposition is between about 3 and 6 J/cm². The energy density must not be too low since vaporization of the front target surface must occur to ablate a given thickness of target material. It also must not be too high or the target material is ablated as large particles, causing a very rough microstructure, indicative of poor electronic quality material.

Extending away, substantially perpendicular, from the spot on the target where the laser beam strikes is a plume-shaped plasma zone 9. One or more heated substrates 8 are mounted so as to be within the plasma plume adjacent to the target 6.

In the laser ablation deposition process, at least one target is provided. The target is fabricated of germanium and/or silicon material. The process may include a plurality of targets (such as for fabrication of layered materials) and the targets may be an alloy of Ge and Si material or a mixture of Ge and Si. The target may also contain macroscopic portions of Ge and Si, preferably microcrystalline, polycrystalline or single crystal materials. The targets may also contain p-type and/or n-type dopants such as boron or phosphorus, or a bond gap widening element such as carbon in either alloyed or mixed form.

Laser ablation deposition is performed in an environment including at least H₂ has. However, other gases may be included to incorporate other elements into the Ge and/or Si alloy materials. Examples of such gases include silane, germane, methane, silicon tetrafluoride, germanium tetrafluoride, methane, acetylene, carbon tetrafluoride, fluorine, phosphine, borane, diborane, and mixtures thereof. The laser beam serves to photodissociate the H₂ (and other gases), producing free radicals or other activated species for the deposition. The flow rate of H₂ is typically between 5 and 15 sccm. Importantly, fluorine can be incorporated into the amorphous alloy materials by including fluorine in the background gas during deposition. Typical fluorine incorporation into the amorphous semiconductor materials is between about 3 and about 7 atomic percent. The advantages of fluorine incorporation have been detailed hereinabove and form one important aspect of the instant invention.

The substrate temperature is varied between room temperature and 250° C. The H₂ background pressure is varied between 3 mTorr to 1000 mTorr and the repetition rate of laser pulses is between about 1 and about 50 Hz. For this range of parameters, a 20 minute deposition yields a film of about 0.7 μm thick. The deposition rate is between about 1 and about 5 Å/pulse.

To ensure minimum contamination, the deposition chamber is evacuated to very low pressures, before the reaction gas is introduced. Typical vacuum levels are between about $10^{-4}$ and about $10^{-8}$ Torr background pressure. The substrates can be formed of any desired material which will withstand the deposition temperature. Typical substrates used are c-Si wafers and 7059 glass.

IR measurements are performed on samples grown on c-Si wafers. The c-Si wafers used are polished on one side and are formed of n-type Si with a resistivity of about 4 Ω cm. The wafers were chemically etched to smoothen the surface and reduce light scattering in the IR spectrometer.

Sample thickness and energy gap are calculated from transmission and reflection spectra taken in a PE330 spectrophotometer. Since the sample size is smaller than the sample holder and the beam size of the spectrophotometer, apertures with a diameter of d=5 mm are used to reduce the beam size. The band gap energy is calculated from a Tauc plot: $(\alpha h\nu)^{\frac{1}{2}}$ versus hν.

In the conductivity measurements, Ag electrodes, 4 mm long separated by a 1 mm gap, are painted on samples grown on 7059 glass. The ohmicity of the electrodes is always checked to make sure that the measurements are taken within an ohmic range. The dark conductivity ($\sigma_d$) is measured while the samples are slowly annealed up (0.1° C./sec) in vacuum to 210° C. and then cooled down slowly to room temperature. The conductivity curve during the first heating process is in most cases not reproducible because of residual metastable behavior right after deposition, especially for those samples made at room temperature. The cooling curve is always reproducible and reversible since the sample is annealed at 210° C. Activation energies and conductivity prefactors are measured from the conductivity taken while the samples are slowly cooled.

In order to obtain reliable photoconductivity ($\sigma_p$) and mobility-lifetime product ($\eta\mu\tau$), samples should be illuminated with band-gap light so that the absorption can be homogeneous through out the bulk. A band-pass filter with an optical band-pass width of 10 nm was used to obtain 1.13 eV light. The flux intensity was $10^{15}$ protons/cm², calibrated with a photodiode. The light intensity behind the sample was monitored and it was determined that the transmitted light is about 15–30% of the input light for most samples. Since photoconductivity generated with such an illumination is normally four orders of magnitude smaller than the dark conductivity $\sigma_d$, a modulation technique was used to select the weak $\sigma_p$ signal from $\sigma_d$. The light was chopped at 6 Hz and the signal was measured with a lock-in amplifier from a load resistor which was connected to the sample in series.

The mobility-lifetime ($\eta\mu\tau$) product was calculated from the following relationship:

$$\sigma_p = (\eta\mu\tau)F_{abs}e/d$$

where e is electron charge, d is the sample thickness, and $F_{abs}$ is the photon flux which was absorbed by the sample. The transmission and reflection of these samples at 1.13 eV was measured with a spectrophotometer. Then the reflected and transmitted light were subtracted from the from the incident photon flux F to get $F_{abs}$.

For the purpose of comparison, a series of a-Ge:H samples were fabricated by glow discharge deposition in a Load-Lock system from a precursor mixture of GeH₄ diluted in H₂ (GeH₄/H₂=1/40 ratio). For three samples, the substrates were kept at 250° C., 150° C. and room temperature, respectively. The rf power density was 0.1 W/cm² and the deposition pressure was 0.95 Torr.

Laser ablation deposited a-Ge:H has a highly specular surface for appropriate deposition parameters. Scanning Electron Microscope (SEM) photographs show very few defects or pinholes on the film surface. Transmission Electron Microscope (TEM) photograph of laser ablation deposited a-Ge:H shows no microstructure, which is a signature of very high quality glow discharge deposited a-Ge:H. Detailed deposition parameters (Tables 1a and 1b) and optoelectronic properties (Tables 2a and 2b) for laser ablation deposited and comparative glow discharge deposited materials are listed, hereinbelow.

Figure 2:
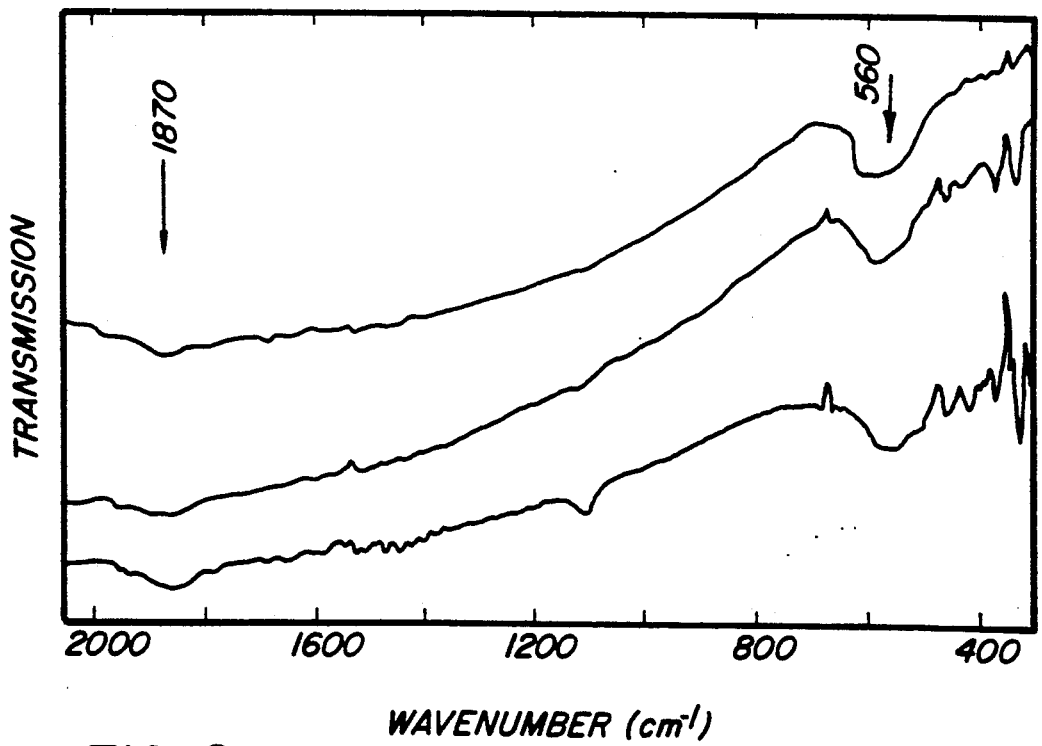
FIG. 2 is a graphical representation of the infrared spectra of three a-Ge:H samples made by the laser ablation depostion system illustrated in FIG. 1; onto substrates, at room temperature under 30 mTorr H$_2$ background pressure (lowermost spectrum), 180° C. under 100 mTorr H$_2$ background pressure (middle spectrum), and 200° C. under 300 mTorr background pressure (uppermost spectrum)

FIG. 2 is a graphical representation of the infrared spectra of three a-Ge:H samples laser ablation deposited onto substrates at room temperature under 30 mTorr H₂ pressure (lowermost spectrum), 180° C. under 100 mTorr H₂ pressure (middle spectrum), and 200° C. under 300 mTorr pressure(uppermost spectrum). All three samples were made with 3000 laser pulses and are about 0.4 μm thick. The infrared transmission is plotted on the ordinate and is shifted for better clarity. These spectra have two peaks corresponding to GeH stretching vibration (1870 cm⁻¹) and GeH wagging vibration (560 cm⁻¹). The bump at 1105 cm⁻¹ is due to substrate mismatch since the c-Si in the reference beam is not identical to the sample substrate. The sharp steps at 1955 cm⁻¹ and 620 cm⁻¹ are due to grating change during the scan. There are no absorption peaks at 825, 765 and 2000 cm⁻¹, suggesting that there are no GeH₂ or (GeH₂)ₙ in these samples. GeH₂ and (GeH₂)ₙ are not preferred in the material since these Ge-H bonds are easy to break and hence are deleterious to the optoelectronic properties of the photovoltaic material. The same is true of laser ablation deposited a-Si:H samples (i.e., SiH₂ and higher order silicon hydrides are undesirable in the a-Si:H) material. The laser ablation deposited materials are characterized by the substantial absence of hydrides, other than the monohydride, even for samples made at room temperature. This substantial absence of higher order hydrides in the material provides for a reduced sensitivity to Stabler/Wronski (photo-induced) degradation. No obvious change is found in the IR spectrum when the substrate temperature varies between room temperature and 200° C. during deposition and when H₂ pressure ($P_{H2}$) varies between 30 mTorr and 400 mTorr. For a sample made at room temperature and with $P_{H2}$=600 mTorr, germanium dihydride peaks appear.

In order to calculate the H content in laser ablation deposited a-Ge:H, reference is made to the 560 cm⁻¹ peak according to:

$$N_H = 1.1 \times 10^{19} \int \alpha dw/w (cm^{-3})$$

where $N_H$ is the number of H atoms per cm³. For one sample, the integrated area for the 560 cm⁻¹ peak is αdw/w=213 cm⁻¹, so $N_H$=2.34×10²¹/cm³. Since the density of Ge is 4.5×10²²/cm³, the H contents of this sample is 5.0 at. %. The H contents of other laser ablation deposited samples are about range between about 3 and about 7 atomic %.

Figure 3:
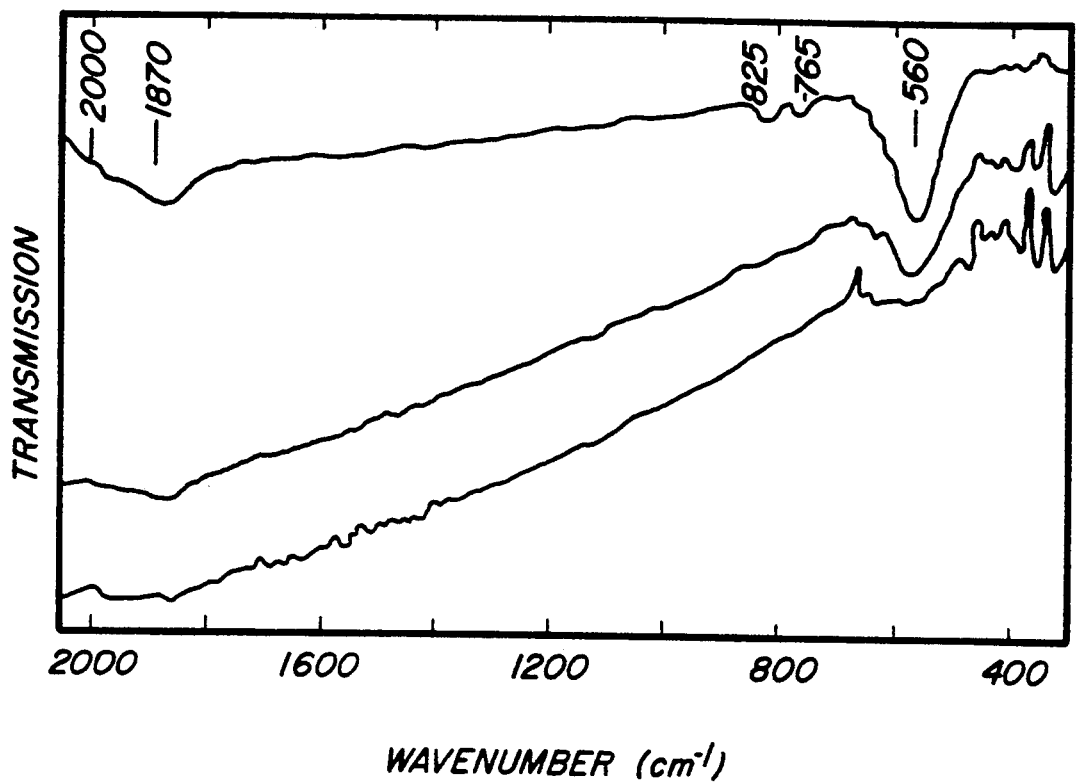
FIG. 3 is a graphical representation of the infrared spectra of three a-Ge:H samples made by R.F. glow discharge CVD onto substrates at room temperature (uppermost spectrum), 150° C. (middle spectrum), and 250° C. (lowermost spectrum), which samples were 0.4, 0.32 and 0.28 μm thick respectively.

FIG. 3 is a graphical representation of the infrared spectra of three comparative a-Ge:H samples made by r.f. glow discharge deposition onto substrates at room temperature (uppermost spectrum), 150° C. (middle spectrum), and 250° C. (lowermost spectrum). These films were 0.4, 0.32 and 0.28 μm thick, respectively. The glow discharge deposited samples were produced by the method disclosed by Li, et al, in "Substrate Temperature Dependence of the Optical and Electrical Properties of Glow Discharge Produced a-Ge:H", *Materials Research Society Symposium Proceedings*, Vol. 149, pages 187-92, 1989. This r.f. CVD method is recognized as producing the best glow discharge a-Ge:H films to date and the quality of the material produced for comparison to the laser ablated material of the instant invention approximates the quality of that made by Li, et al. All three comparative samples were made by a 40 minute glow discharge plasma deposition of GeH₄ and H₂ gas mixture with a gas ratio of GeH₄/H₂=1/40, a power of 15 watts, and a pressure of 0.95 Torr. As in the laser ablation deposited materials, these samples also show the GeH vibrational absorption at 1870 cm⁻¹ and 560 cm⁻¹. In addition, the room temperature substrate sample has peaks at 825 and 765 cm⁻¹ as well as some change at 2000 cm⁻¹, suggesting a very large fraction of incorporated GeH₂ and (GeH₂)ₙ in the material. When the substrate temperature is increased to 150° C., the GeH₂ and (GeH₂)ₙ inclusion disappears, however, the H content of the material also decreases. At a substrate temperature of 250° C., most of the H effuses out of the material during deposition.

Compared to glow discharge deposited a-Ge:H, laser ablation deposited samples do not show any undesired GeH₂ bonds, even for samples made at room temperature. Measurement of the infrared spectrum of laser deposited samples many days after fabrication show no changes therein, indicating that the laser ablation deposited a-Ge:H is more dense (i.e., has a reduced porosity) than and lacks the porous structure of r.f. glow discharge deposited a-Ge:H and are therefore less susceptible to the atmospheric contamination problems associated with glow discharge a-Ge:H, such as oxygen and moisture pick-up.

Figure 4:
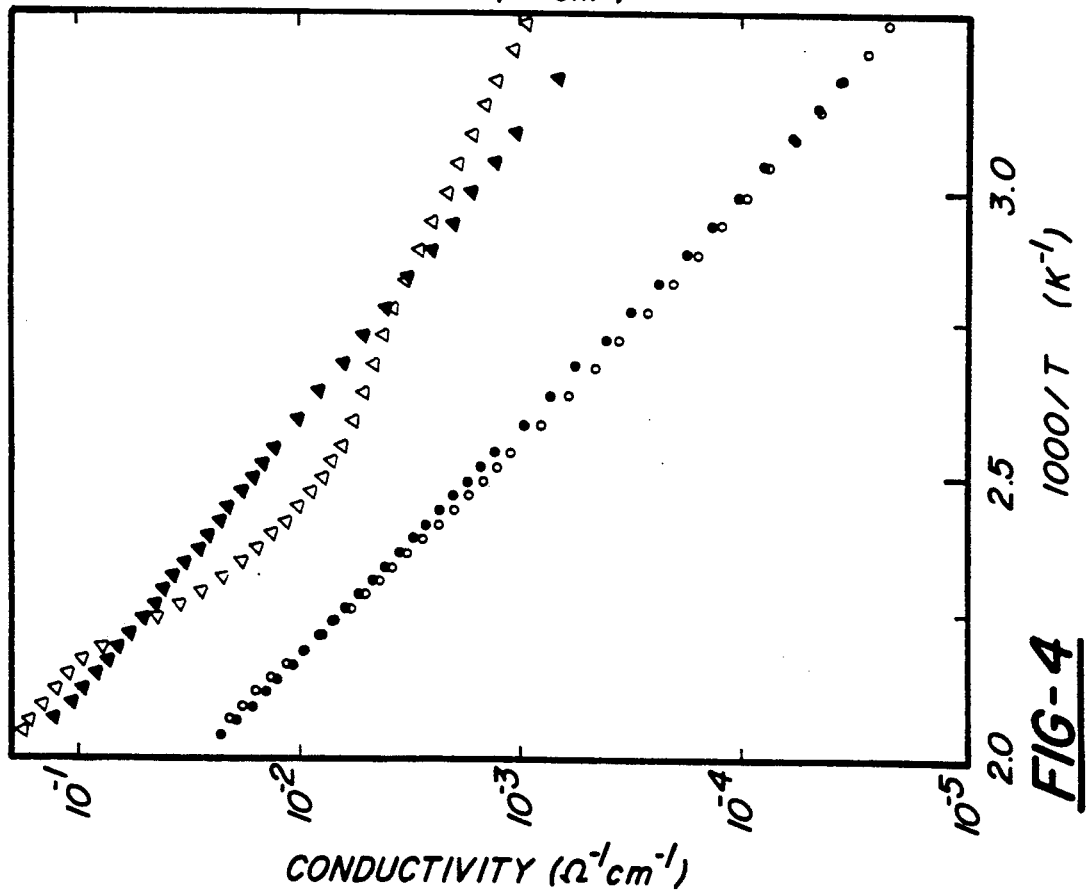
FIG. 4 is a graphical representation of the temperature dependence of the dark conductivity for two laser ablation deposited samples with substrate temperatures of room temperature (triangles) and 180° C. (circles) plotting dark conductivity on the ordinate and 1000/T on the abscissa, the open symbols are the dark conductivity measured during a first slow anneal and the solid symbols are measured during slow cooling from 210° C.

FIG. 4 is a graphical representation of the temperature dependence of the dark conductivity for two laser ablation deposited samples fabricated with substrate temperatures of room temperature (triangles) and 180° C. (circles), plotting dark conductivity on the ordinate and 1000/T on the abscissa, the open symbols are the dark conductivity measure during the first slow anneal and the solid symbols are measured during slow cooling from 210° C. The first heating curve of the sample made at room temperature is irreproducible and different from the cooling curve. It is believed that metastable states are produced during deposition at room temperature. Samples made at 150° C. or above do not show such an anomalous first heating curve since these samples were annealed during deposition. The dark conductivity versus temperature curves measured during cooling are usually thermally activated.

The dark conductivity versus temperature curves of 14 laser ablation deposited samples were measured. With few exceptions, the dark conductivity versus temperature curves fall into two groups. Samples made at high temperature (above 120° C.) have dark conductivity versus temperature curves which are close to that of the sample made at a substrate temperature of 180° C. (i.e., circles on FIG. 4). Samples made at room temperature have dark conductivity versus temperature curves which are close to that of the sample made at room temperature and depicted in FIG. 4 (i.e., the triangles).

Figure 5:
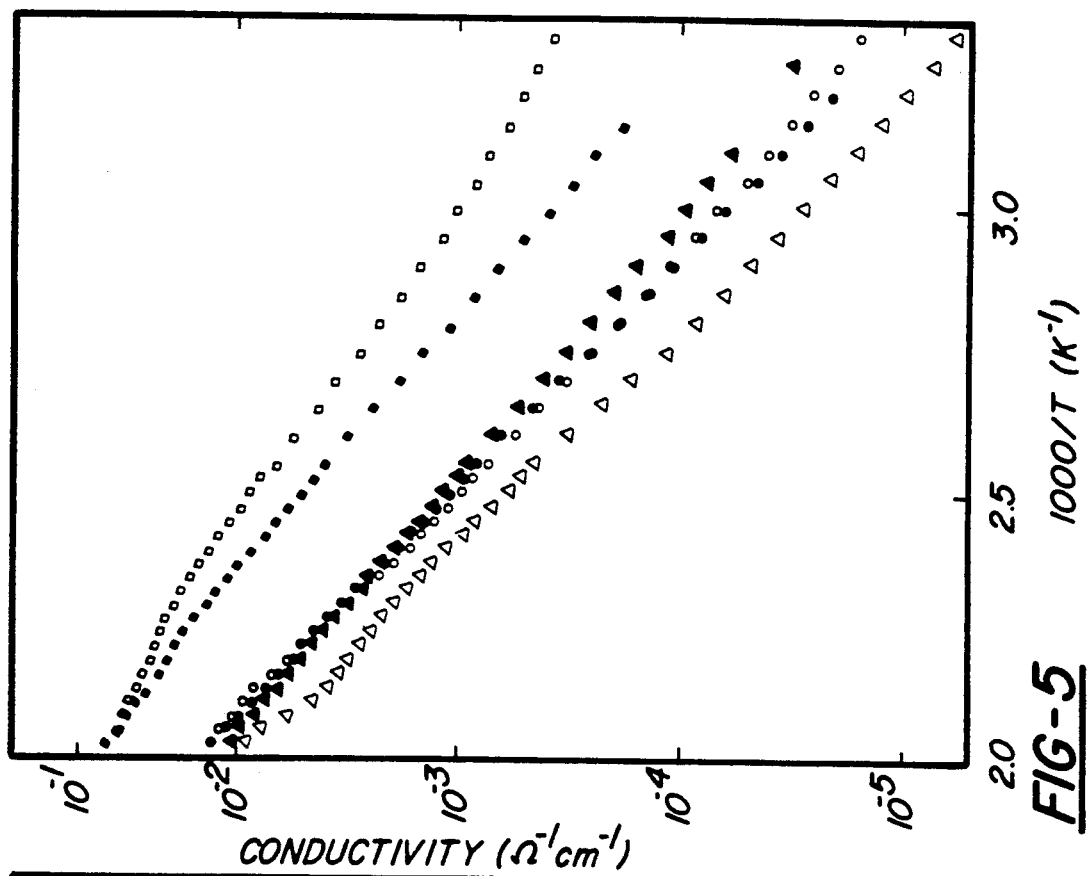
FIG. 5 is a graphical representation of the temperature dependence of the dark conductivity for three samples produced by R.F. glow discharge CVD at 250° C. (squares), 150° C. (circles) and room temperature (triangles), respectively, and plotting dark conductivity on the ordinate and 1000/T on the abscissa. The open symbols represent the dark conductivity during the anneal and the solid symbols representing the dark conductivity during slow cooling from 210° C.

FIG. 5 is a graphical representation of the temperature dependence of the dark conductivity for three samples produced by r.f. glow discharge deposition at 250° C. (squares), 150° C. (circles) and room temperature (triangles), respectively, and plotting dark conductivity on the ordinate and 1000/T on the abscissa. The open symbols represent the dark conductivity during the anneal and the solid symbols represent the dark conductivity during cooling from 210° C. Again, as above, dark conductivity versus temperature curves measured during slow cooling are thermally activated.

Figure 6:
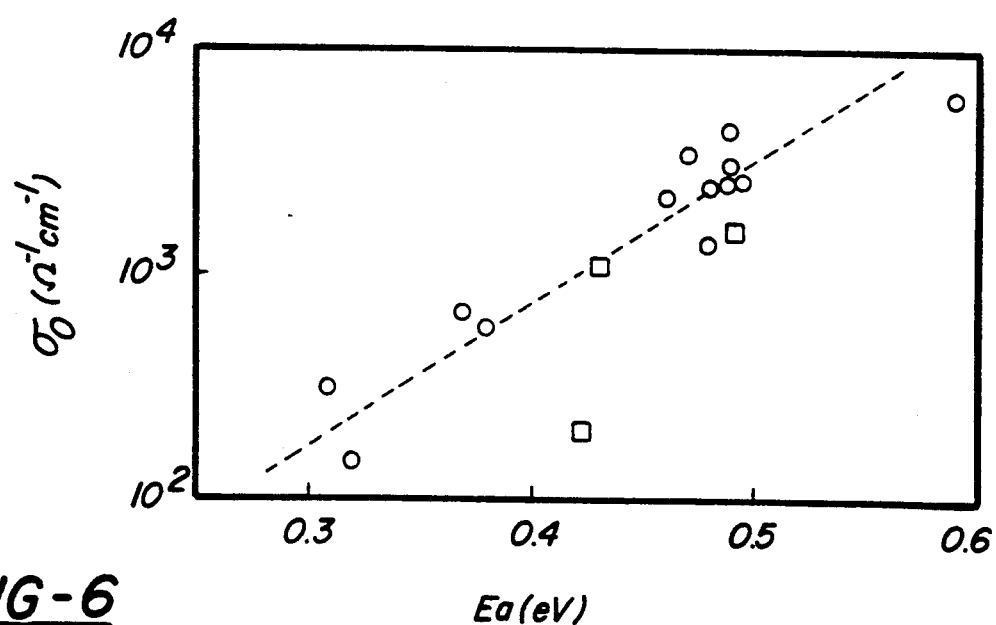
FIG. 6 is a graphical representation of the Meyer-Neldel relationship between the conductivity prefactor, $\sigma_o$, plotted on the ordinate, and the activation energy, $E_a$, plotted on the abscissa, for laser ablation deposited samples (circles) and glow discharge RFCVD samples (squares)

FIG. 6 is a graphical representation of the Meyer-Neldel relationship between the conductivity prefactor $\sigma_o$, plotted on the ordinate, and the activation energy $E_a$, plotted on the abscissa, for laser ablation deposited samples (circles) and r.f. glow discharge deposited samples (squares). The activation energies $E_a$ and the conductivity prefactors $\sigma_o$ are calculated from the dark conductivity versus temperature cooling curves of FIGS. 4 and 5. The activation energy $E_a$ and the conductivity prefactor $\sigma_o$ for 12 laser ablation deposited a-Ge:H and 3 r.f. glow discharge deposited a-Ge:H samples are plotted in FIG. 6. As is clearly seen, the samples follow a Meyer-Neldel rule.

Figure 7A:
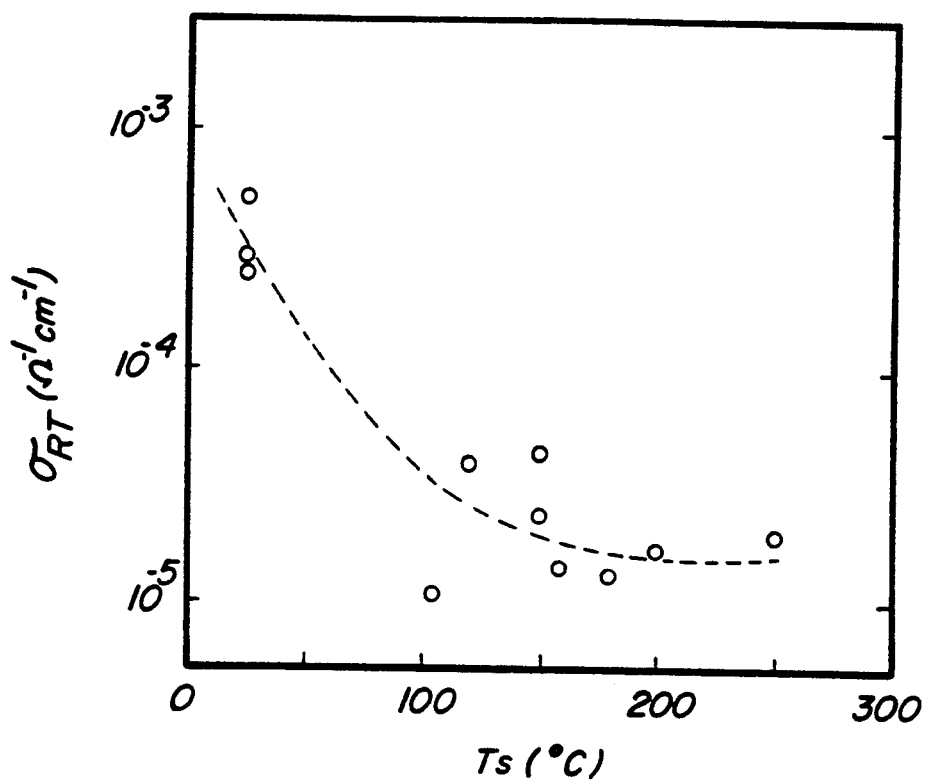
FIG. 7a is a graphical representation of the room temperature conductivity, plotted on the ordinate, as a function of the substrate deposition temperature, plotted on the abscissa, for laser ablation deposited samples.
Figure 7B:
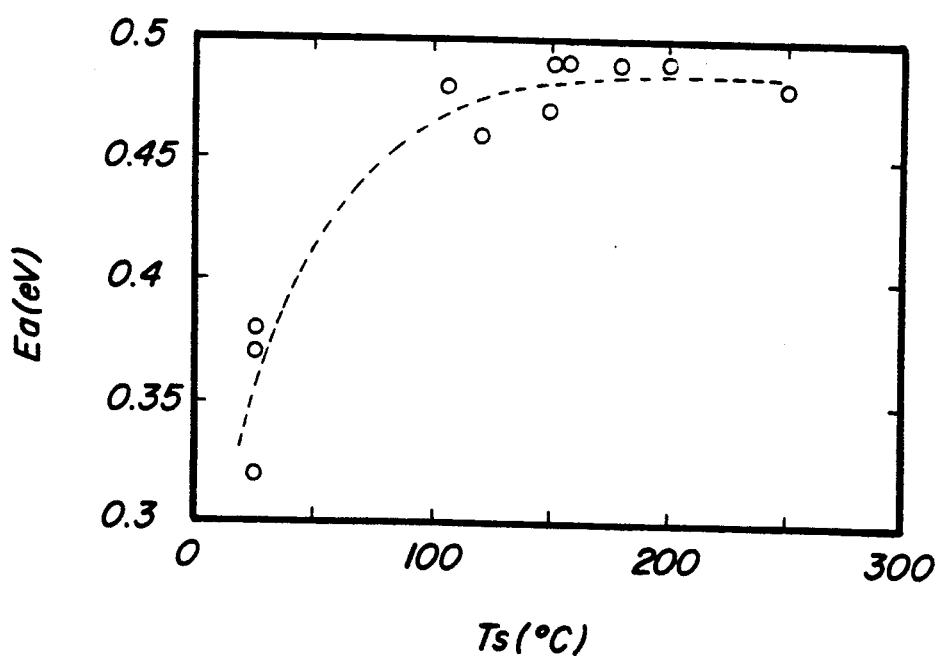
FIG. 7b is a graphical representation of the activation energy, plotted on the ordinate, as a function of the substrate deposition temperature for laser ablation deposited samples.

The electronic properties of laser deposited samples strongly depend on the deposition temperature, and are relatively less sensitive to the H$_2$ pressure within the 100 to 400 m Torr range. To show the effect of deposition substrate temperature ($T_s$), there is depicted in FIGS. 7a and 7b, respectively, the room temperature conductivity ($\sigma_{RT}$) and the activation energy $E_a$ as a function of substrate temperature $T_s$ for laser ablation deposited a-Ge:H samples. Samples fabricated at substrate temperatures between about 150° C. and about 200° C. have the lowest room temperature conductivity $\sigma_{RT}$ and the highest activation energies $E_a$ (0.49 eV) which indicate that the Fermi level of these samples lie approximately at the center of the band-gap. Samples deposited at room temperature have higher room temperature conductivities $\sigma_{RT}$ and smaller activation energies $E_a$. For these samples, the Fermi level positions are closer to the band edge, presumably, the conduction band edge.

Figure 8:
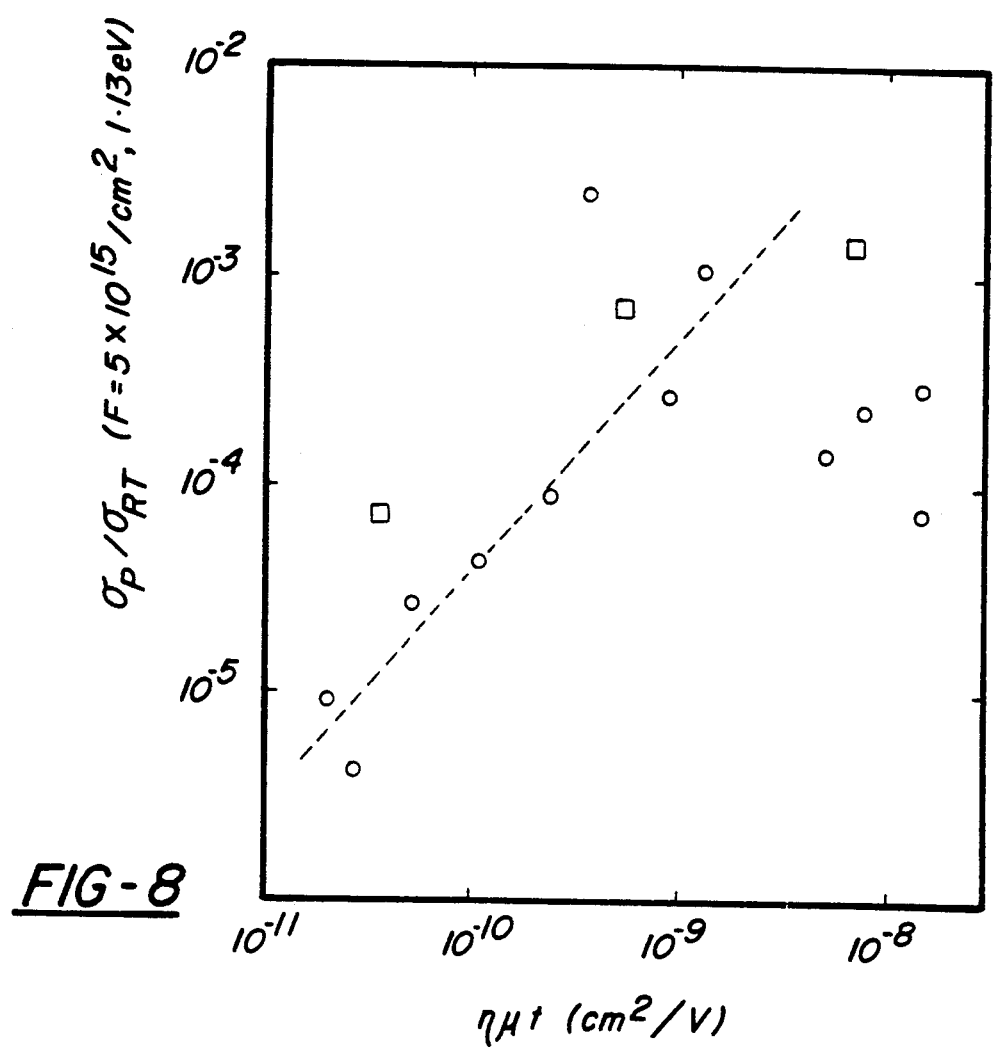
FIG. 8 is a graphical representation of the ratio of photoconductivity to room temperature conductivity, plotted on the ordinate, versus the mobility-lifetime product, for laser ablation deposited (circles) and glow discharge deposited (squares) a-Ge:H samples; the photoconductivity measured with 1.13 eV illumination at a photon flux $5 \times 10^{15}$ (cm$^{-2}$S$^{-1}$)

FIG. 8 is a graphical representation of the ratio of photoconductivity to room temperature conductivity (photosensitivity), plotted on the ordinate, versus the mobility-lifetime product, for laser ablation deposited (circles) and r.f. glow discharge deposited (squares) a-Ge:H samples. The photoconductivity of the samples was measured with 1.13 eV illumination at a photon flux of $5 \times 10^{15}$ (cm$^{-2}$ s$^{-1}$) chopped at 6 Hz. The mobility-lifetime product ($\eta\mu\tau$) is obtained as described hereinabove. Samples with large photosensitivity $\sigma_p/\sigma_{RT}$ and mobility-lifetime product ($\eta\mu\tau$) are best for use in photovoltaic applications. As can be seen from a perusal of FIG. 8, laser ablation deposited samples made at room temperature have larger mobility-lifetime products $\eta\mu\tau$ but normal photosensitivity $\sigma_p/\sigma_{RT}$ because the room temperature conductivity $\sigma_{RT}$ is high for these samples. It should be noted that the laser ablation deposited samples and the r.f. glow discharge samples have about the same photosensitivity.

The coefficient of optical absorption in the visible light range were measured from a transmission and reflection spectrum. Then the band-gap energy was calculated from a Tauc plot. The band-gap of laser ablation deposited a-Ge:H was surprisingly found to be about $0.91 +/- 0.02$ eV while that of r.f. glow discharge deposited a-Ge:H was (and is known to typically be) about $1.06 +/- 0.03$ eV. Energy dispersive spectroscopy (EDS) and wavelength dispersive spectroscopy (WDS) did not detect any other unexpected elements in the laser ablation deposited a-Ge:H which might account for this 0.15 eV difference in band gap energy. At the present time, the inventors do not know why the laser ablation deposited a-Ge:H has a smaller band-gap, but it is indicative of the fundamentally different deposition process.

Figure 9:
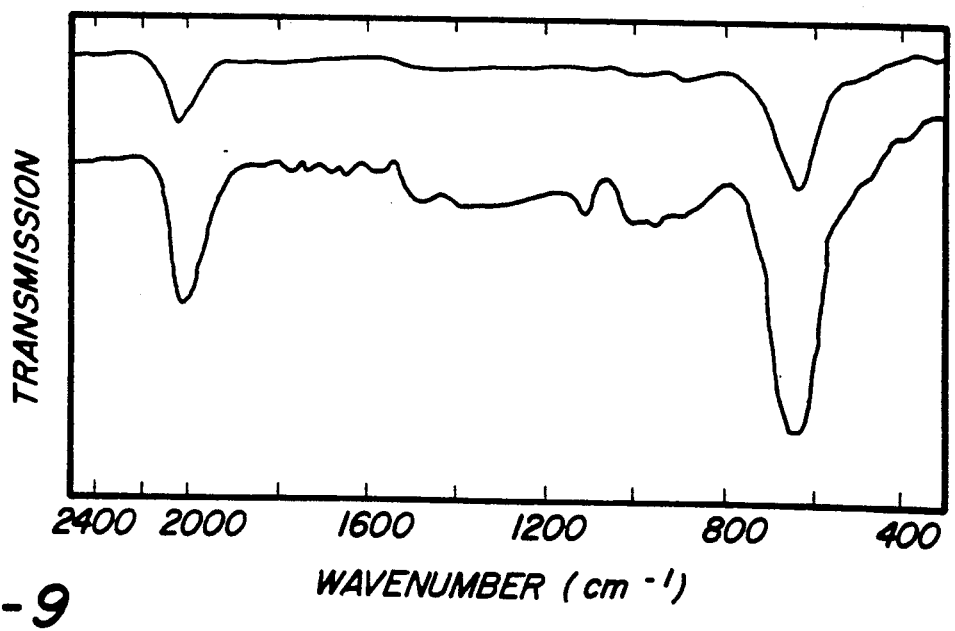
FIG. 9 is a graphical representation of the infrared spectra of two a-Si:H samples laser ablation deposited onto substrates at room temperature under 100 mTorr H$_2$ pressure (lowermost spectrum) and at 220° C. under 100 mTorr pressure (uppermost spectrum).

FIG. 9 is a graphical representation of the infrared spectra of two a-Si:H samples laser ablation deposited onto substrates at room temperature under 100 mTorr H$_2$ pressure (lowermost spectrum) and at 220° C. under 100 mTorr pressure (uppermost spectrum). Due to the larger film thickness of the sample fabricated at 220° C., the magnitude of the IR spectrum thereof was reduced by a factor of 10. As was the case for laser ablation deposited a-Ge:H, the laser ablated a-Si:H samples show strong silicon monohydride peaks on the infrared spectra and are notably characterized by the substantial absence of higher order silicon hydrides. The density of states for the laser deposited a-Si:H is $2 \times 10^{16}$/cm$^3$ as measured by the Contrast Photocurrent Method. The result is an improved material.

An a-SiGe$_x$:H alloy was also made by laser ablation deposition by putting SiF$_4$ in the chamber together with H$_2$. This sample was fabricated with a reaction gas background pressure of 100 mTorr with a gas composition of SiF$_4$ and H$_2$ having a gas ratio SiF$_4$/H$_2$=1/6. This sample demonstrated a much higher activation energy (0.59 eV) and a smaller room temperature conductivity $\sigma_{RT}$ ($7 \times 10^{-7}$ $\Omega^{-1}$cm$^{-1}$). WDS analysis determined the presence of about 3% Si inside this a-SiGe$_x$:H alloy.

The following description is provided for the purpose of presenting the inventor's insight into the laser ablation deposition process and the reaction mechanism at the substrate surface. When a high energy density laser pulse hits the target, it vaporizes the top layer and changes some of the vaporized atoms into highly excited states. The plume shaped discharging zone is probably due to the downward transitions of electrons from these excited states back to their ground state, producing some spectral emissions.

Before the incident UV photons of the laser beam hits the target, it travels inside the chamber which has been filled with reaction gas. These photons are highly energetic (5 eV) and have large reaction probability with the gas molecules due to the high flux density ($2 \times 10^{26}$ photons/cm$^2$s) thereof. These 5 eV photons will dissociate the gas molecules and produce free radicals (such as H$_2^+$, H$^+$ for hydrogen gas) therefrom. The laser power and wavelength can be controlled during the deposition to insure that free radicals are formed in the deposition chamber during deposition. These free radicals will react with the vaporized highly excited target atoms at the growing surface to form a reaction product film. Additionally, a d.c., r.f. or microwave plasma can be provided in the deposition chamber so as to assist in the dissociation of gaseous precursors introduced in the background gas.

An estimate of the thickness of the ablated layer after each pulse and the deposition rate for each pulse may be calculated based on well-known constants. Ge will be used as an example. For simplicity, it is assumed that a Ge layer of thickness d on the front surface of the target absorbs all of the incoming energy and thereby vaporizes. Therefore, the heat transferred to the target bulk is ignored. The following relationships will then hold true:

$$E \cdot A = cm \, (T_{boil} - 25^\circ \text{C.}) + L_{melt} \cdot m + L_{vap} \cdot m$$

$$m = \rho \cdot A \cdot d$$

where

E = incoming energy density for one pulse. In our case E = 5.4 J/cm$^2$.

A = area. In our case, A = 0.051 cm$^2$.

d = thickness of the ablated layer, the value we want to estimate.

$\rho$ = density. For Ge, $\rho$ = 5.32 g/cm$^3$.

m = mass of the ablated Ge layer with thickness d and area A.

c = specific heat. For Ge, c = 322 J/kg·K $L_{melt}$ = heat of fusion. For Ge, $L_{melt}$ = 4.8 × 10$^5$ J/Kg.

$L_{vap}$ = heat of vaporization. For Ge, $L_{vap}$ = 4.6 × 10$^6$ J/Kg.

$T_{boil}$ = boiling point. For Ge, $T_{boil}$ = 3100K.

After substitution of the proper values, the thickness of the layer ablated from the target by a single laser pulse is calculated to be d = 1.7 μm. Of course, the actual thickness of the layer ablated from the target is smaller than this estimated value since most of the heat is transferred to the bulk of the target.

Assuming the ablated atoms spread out homogeneously in a 180 degree hemisphere, and deposit a layer of thickness s on the substrate at distance 1 away from the target, then A·d = 2·π·1$^2$s where 1 = 5 cm. If we use d = 1.7 μm, we get s = 5.4 Å deposited for a single pulse. The real deposition for a single pulse has been measured to be 1.4 Å. The actual deposition rate is different than calculated one for the following reasons. First, a large portion of the laser light is lost due to reflection by the target surface and another portion of the laser energy is absorbed by the target bulk, this reflection/bulk absorption reduces the thickness of the layer of target material which is vaporized by the laser pulse well below the 1.7 μm thickness calculated for a single pulse. Second, although the ablated Ge atoms collide with the gases in the chamber during their flight to the substrate, thereby changing their course and being deflected away from the substrate, the assumption than the germanium atoms spread out homogeneously in a 180 degree hemisphere is incorrect and in actuality the atoms are fairly well directed toward the substrate surface.

While the disclosure set forth hereinabove primarily describes the fabrication of a-Ge:H and a-Si:H by laser ablation deposition, other amorphous hydrogenated materials, such as a-Si:Ge:H, a-SiC$_x$:H and layered amorphous materials, could be fabricated without departing from the spirit or scope of the instant invention.

Of particular interest is a multi-layered narrow band gap structure composed of a plurality of layer pairs. These layer pairs are fabricated of a first discrete layer of a-Si:H and a second discrete layer of a-Ge:H, and each layer of the pair is between about 5 and about 30 Å thick. Each layer of the layer pair is also characterized by the substantial absence of hydrides, other than the monohydrides. Also, each of the germanium and silicon layers of the layer pairs are characterized by a mobility-lifetime product of about $1 \times 10^{-8}$ and about $1 \times 10^{-7}$ cm$^2$/V, respectively, and a density of states of about $1 \times 10^{17}$/cm$^3$ and about $2 \times 10^{16}$/cm$^3$, respectively. By employing this type of synthetic nanolayered structure, the incident photons can be "tricked" into thinking that the structure is of a wider band than the narrow band gap layer and, therefore, will not be trapped in the recombination centers present in the steeper tail states of the narrow band gap layer.

The laser ablation deposition processes disclosed herein provide a simple, fast means for the fabrication of high quality amorphous hydrogenated germanium and silicon alloy materials, which materials are particularly suitable for photovoltaic use. The methods have already produced materials which are as good as industry's best glow discharge deposited materials (which have optimized for over two decades) without the requirement for the expensive, complicated glow discharge apparatus. Also, the laser ablation process provides multi-parameter control over the composition of the deposited film because the precursor materials can be excited by different mechanisms.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

TABLE 1a

| Sample Number (LD) | Temperature Substrate (°C.) | Pressure Hydrogen (mTorr) | Deposition Time (min.) | Repetition Rate (Hz) | Film Thickness (μm) |
|---|---|---|---|---|---|
| 1 | room temp. | 106 | 10 | 5 | 0.52 |
| 2 | room temp. | 30 | 10 | 5 | 0.38 |
| 3 | 180 | 100 | 10 | 5 | 0.40 |
| 4 | 198 | 300 | 10 | 5 | 0.45 |
| 5 | room temp. | 100 | 10 | 5 | 0.36 |
| 6 | 180 | 400 | 10 | 5 | 0.35 |
| 7 | 250 | 400 | 10 | 5 | 0.41 |
| 8 | 150 | 100 | 10 | 5 | 0.21 |
| 9 | 120 | 100 | 10 | 5 | 0.26 |
| 10 | 150 | 100 | 30 | 5 | 1.11 |

TABLE 1a-continued

| Sample Number (LD) | Temperature Substrate (°C.) | Pressure Hydrogen (mTorr) | Deposition Time (min.) | Repetition Rate (Hz) | Film Thickness ($\mu$m) |
|---|---|---|---|---|---|
| 11 | 160 | 100 | 20 | 5 | 0.88 |
| 12 | 90 | Total = 100 SiF$_4$/H$_2$ = 1/6 | 20 | 5 | 0.81 |

TABLE 1b

| Sample Number (RF CVD) | Temperature Substrate (°C.) | P (mTorr) GeH$_4$/H$_2$ = 1/40 | Deposition Time (min.) | Deposition Power (Watts) | Film Thickness ($\mu$m) |
|---|---|---|---|---|---|
| 1 | 250 | 950 | 40 | 15 | 0.28 |
| 2 | 150 | 950 | 40 | 15 | 0.32 |
| 3 | 38  | 950 | 40 | 15 | 0.40 |

TABLE 2a

| Samp. No. (LD) | Band Gap (ev) | Cond. Rm T. ($\Omega$ cm)$^{-1}$ | Cond. Prefact. ($\Omega$ cm)$^{-1}$ | Activat. Energy (eV) | Photo-Cond. ($\Omega$ cm)$^{-1}$ | Photo-Sensitivity | Mobility Lifetime (cm$^2$/V) |
|---|---|---|---|---|---|---|---|
| 1  | 0.93 | $2.6 \times 10^{-4}$ | $5.9 \times 10^2$ | 0.38 | $3.9 \times 10^{-8}$ | $1.5 \times 10^{-4}$ | $5.1 \times 10^{-9}$ |
| 2  | 0.92 | $3.0 \times 10^{-4}$ | $6.8 \times 10^2$ | 0.36 | $7.1 \times 10^{-8}$ | $2.4 \times 10^{-4}$ | $7.7 \times 10^{-9}$ |
| 3  | 0.91 | $1.9 \times 10^{-3}$ | $3.1 \times 10^2$ | 0.31 | $1.5 \times 10^{-7}$ | $8.0 \times 10^{-5}$ | $1.5 \times 10^{-8}$ |
| 4  | 0.91 | $1.7 \times 10^{-5}$ | $3.2 \times 10^3$ | 0.49 | $4.6 \times 10^{-10}$ | $2.8 \times 10^{-5}$ | $5.2 \times 10^{-11}$ |
| 5  | 0.89 | $5.2 \times 10^{-4}$ | $1.4 \times 10^2$ | 0.32 | $1.7 \times 10^{-7}$ | $3.2 \times 10^{-4}$ | $1.5 \times 10^{-8}$ |
| 6  | 0.94 | $1.3 \times 10^{-5}$ | $2.6 \times 10^3$ | 0.49 | $1.5 \times 10^{-8}$ | $1.1 \times 10^{-3}$ | $1.3 \times 10^{-9}$ |
| 7  | 0.94 | $2.1 \times 10^{-5}$ | $2.5 \times 10^3$ | 0.48 | $2.0 \times 10^{-10}$ | $1.0 \times 10^{-5}$ | $2.0 \times 10^{-11}$ |
| 8  | 0.87 | $4.4 \times 10^{-5}$ | $3.5 \times 10^3$ | 0.47 | $2.0 \times 10^{-9}$ | $4.5 \times 10^{-5}$ | $1.1 \times 10^{-10}$ |
| 9  | 0.91 | $4.0 \times 10^{-5}$ | $2.2 \times 10^3$ | 0.46 | $3.7 \times 10^{-9}$ | $9.3 \times 10^{-5}$ | $2.4 \times 10^{-10}$ |
| 10 | 0.88 | $2.4 \times 10^{-5}$ | $4.4 \times 10^3$ | 0.49 | $1.1 \times 10^{-10}$ | $4.5 \times 10^{-6}$ | $2.8 \times 10^{-11}$ |
| 11 | 0.91 | $1.5 \times 10^{-5}$ | $2.6 \times 10^3$ | 0.49 | $4.1 \times 10^{-9}$ | $2.8 \times 10^{-4}$ | $9.0 \times 10^{-11}$ |
| 12 | 0.90 | $7.1 \times 10^{-7}$ | $6.3 \times 10^3$ | 0.59 | $1.8 \times 10^{-9}$ | $2.5 \times 10^{-3}$ | $3.6 \times 10^{-10}$ |

TABLE 2b

| Samp. No. (G.D.) | Band Gap (ev) | Cond. Rm T. ($\Omega$ cm)$^{-1}$ | Cond. Prefact ($\Omega$ cm)$^{-1}$ | Activat. Energy (eV) | Photo-Cond. ($\Omega$ cm)$^{-1}$ | Photo-Sensitivity | Mobility Lifetime (cm$^2$/V) |
|---|---|---|---|---|---|---|---|
| 1 | 1.09 | $6.3 \times 10^{-5}$ | $1.1 \times 10^3$ | 0.43 | $9.6 \times 10^{-8}$ | $1.5 \times 10^{-3}$ | $6.7 \times 10^{-9}$ |
| 2 | 1.08 | $8.4 \times 10^{-6}$ | $1.5 \times 10^3$ | 0.49 | $6.4 \times 10^{-9}$ | $7.6 \times 10^{-4}$ | $5.1 \times 10^{-10}$ |
| 3 | 1.02 | $4.5 \times 10^{-6}$ | $2.0 \times 10^2$ | 0.42 | $3.4 \times 10^{-10}$ | $7.6 \times 10^{-5}$ | $3.4 \times 10^{-11}$ |

We claim:

1. A method of forming hydrogenated amorphous germanium alloy material, said material characterized by (a) the substantial absence of germanium hydrides, other than the monohydride, (b) a mobility-lifetime product for nonequilibrium charge carriers therein of about $10^{-8}$ cm$^2$/V, and (c) a density of defect states in the band gap of the host matrix thereof of less than about $1 \times 10^{17}$/cm$^3$; said method comprising the steps of:

providing a deposition chamber;
   providing a substrate in said deposition chamber;
   positioning at least one target of germanium containing material adjacent said substrate;
   providing a laser;
   evacuating said deposition chamber to a sub-atmospheric pressure;
   introducing into said evacuated deposition chamber a background gas including a partial pressure of at least hydrogen; and
   depositing, by laser ablation, germanium from said target and hydrogen from said partial pressure onto said substrate; thereby forming on said substrate a layer of hydrogenated germanium alloy material having an amorphous microstructure, said material characterized by the substantial absence of incorporated germanium hydrides, other than the monohydride, a mobility-lifetime product for nonequilibrium charge carriers therein of about $10^{-8}$ cm$^2$/V, and a density of defect states in the band gap of the host matrix thereof of less than about $1 \times 10^{17}$/cm$^3$.

2. The method of claim 1 including the further step of forming said at least one target of crystalline germanium material.

3. The method of claim 1 including the further step of forming said at least one target of germanium-silicon alloy material or mixtures of germanium and silicon.

4. The method of claim 1 including the further step of forming said at least one target of a germanium material which includes one or more p or n dopant elements added thereto.

5. The method of claim 1 including the further step of forming said layer of hydrogenated germanium alloy material so as to be characterized by reduced porosity as compared with plasma CVD deposited hydrogenated germanium alloy material.

6. The method of claim 1 including the further step of forming said layer of hydrogenated germanium alloy material so as to possess a reduced sensitivity to Stabler/Wronski degradation as compared with plasma CVD deposited hydrogenated germanium alloy material.

7. The method of claim 1 wherein said step of evacuating said deposition chamber to a sub-atmospheric pressure comprises evacuating said deposition chamber to a pressure of about $10^{-5}$ Torr or less.

8. The method of claim 1 wherein said step of introducing said background gas comprises introducing said background gas at a pressure of about 30 to about 1000 m Torr.

9. The method of claim 1 including the further step of incorporating one or more additional components in said background pressure, said additional components being selected from the group consisting of silane, germane, silicon tetrafluoride, germanium tetrafluoride, methane, acetylene, carbon tetrafluoride, fluorine, phosphine, borane, diborane, and mixtures thereof.

10. The method of claim 1 including the further step of heating said substrate before depositing said hydrogenated germanium alloy material thereupon.

11. The method of claim 10 wherein said step of heating said substrate comprises heating said substrate to a temperature of up to 250° C.

12. The method of claim 1 including the further step of laser ablation depositing said hydrogenated germanium alloy material at a laser power of about 3 to about 6 Joules/cm$^2$.

13. The method of claim 1 including the further step of laser ablation depositing said hydrogenated germanium alloy material at a laser pulse rate of about 1 to about 50 Hz.

14. The method of claim 1 including the further step of laser ablation depositing said hydrogenated germanium alloy material at a deposition rate of about 1 to about 5 Å/pulse.

15. The method of claim 1 including the further step of controlling laser power and wavelength during said laser ablation deposition process such that free radicals are formed in said deposition chamber.

16. The method of claim 1 including the further step of providing a plasma in said deposition chamber to disassociate gaseous precursors introduced into said background gas into free radical forms thereof.

17. The method of claim 16 including the further step of providing a microwave plasma in said deposition chamber during said laser ablation depositing step.

18. The method of claim 16 including the further step of providing a radio frequency plasma in said deposition chamber during said laser ablation depositing step.

19. The method of claim 1 including the further step of forming said hydrogenated germanium alloy material so as to have an energy gap of about 0.9 eV.

20. A method of forming hydrogenated amorphous silicon alloy material, said material characterized by (a) the substantial absence of silicon hydrides, other than the monohydride, (b) a mobility-lifetime product for nonequilibrium charge carriers therein of about $10^{-7}$ cm$^2$/V, and (c) a density of defect states in the band gap of the host matrix thereof of less than about $2 \times 10^{16}$/cm$^3$; said method comprising the steps of:
providing a deposition chamber;
providing a substrate in said deposition chamber;
positioning at least one target of silicon containing material adjacent said substrate;
providing a laser;
evacuating said deposition chamber to a sub-atmospheric pressure;
introducing into said evacuated deposition chamber a background gas including at least hydrogen; and
depositing, by laser ablation, silicon from said target and hydrogen from said background pressure onto said substrate; thereby forming on said substrate a layer of hydrogenated silicon alloy material having an amorphous microstructure, said material characterized by the substantial absence of incorporated silicon hydrides, other than the monohydride, a mobility-lifetime product for nonequilibrium charge carriers therein of about $10^{-7}$ cm$^2$/V, and a density of defect states in the band gap of the host matrix thereof of less than about $2 \times 10^{16}$/cm$^3$.

21. The method of claim 20 including the further step of forming said at least one target of crystalline silicon material.

22. The method of claim 20 including the further step of forming said at least one target of a semiconductor material selected from the group consisting of silicon-carbon or silicon-germanium alloys or mixtures thereof.

23. The method of claim 20 including the further step of forming said at least one target of silicon material which includes one or more p or n dopant elements.

24. The method of claim 20 including the further step of forming said layer of hydrogenated silicon alloy material so as to possess reduced porosity as compared with plasma CVD deposited hydrogenated silicon alloy material.

25. The method of claim 20 including the further step of forming said layer of hydrogenated silicon alloy material so as to have a reduced sensitivity to Stabler/Wronski degradation as compared with plasma CVD deposited hydrogenated silicon alloy material.

26. The method of claim 20 wherein said step of evacuating said deposition chamber to a sub-atmospheric pressure comprises evacuating said deposition chamber to a pressure of about $10^{-5}$ Torr or less.

27. The method of claim 20 wherein said step of introducing said background gas comprises introducing said background gas at a pressure of about 30 to about 1000 m Torr.

28. The method of claim 20 including the further step of including one or more additional components in said background gas, said additional components being selected from the group consisting of silane, germane, methane, acetylene, silicon tetrafluoride, germanium tetrafluoride, carbon tetrafluoride, fluorine, phosphine, borane, diborane, and mixtures thereof.

29. The method of claim 20 including the further step of heating said substrate before depositing said hydrogenated silicon alloy material thereupon.

30. The method of claim 29 wherein said step of heating said substrate comprises heating said substrate to a temperature of up to 250° C.

31. The method of claim 20 including the further step of laser ablation depositing said hydrogenated silicon alloy material at a laser power of about 3 to about 6 Joules/cm$^2$.

32. The method of claim 20 including the further step of laser ablation depositing said hydrogenated silicon alloy material at a laser pulse rate of about 1 to about 50 Hz.

33. The method of claim 20 including the further step of laser ablation depositing said hydrogenated silicon alloy material at a deposition rate of about 1 to about 5 Å/pulse.

34. The method of claim 20 including the further step of controlling laser power and wavelength during said laser ablation deposition process such that free radicals are formed in said deposition chamber.

35. The method of claim 20 including the further step of providing a plasma in said deposition chamber to disassociate gaseous precursors introduced into said background gas into free radical forms thereof.

36. The method of claim 35 including the further step of providing a microwave plasma in said deposition chamber during said laser ablation depositing step.

37. The method of claim 35 including the further step of providing a radio frequency plasma in said deposition chamber during said laser ablation depositing step.

38. The method of claim 20 including the further step of forming said layer of hydrogenated silicon alloy material so as to have an energy gap of about 2.1 eV.

39. A method of forming a multi-layered structure of hydrogenated amorphous germanium and amorphous silicon alloy material; the structure defined by a plurality of layer pairs, each germanium and silicon layer of said layer pair characterized by (a) the substantial absence of germanium hydrides and silicon hydrides, other than the monohydrides, respectively, (b) a mobility-lifetime product for nonequilibrium charge carriers therein of about $10^{-8}$ and about $10^{-7}$ cm$^2$/V, respectively, and (c) a density of defects states in the host matrix thereof of about $1 \times 10^{17}$/cm$^3$ and about $2 \times 10^{16}$/cm$^3$, respectively; said method comprising the steps of:

providing a deposition chamber;

providing a substrate in said deposition chamber;

positioning at least one target adjacent said substrate, said target including silicon and/or germanium material;

providing a laser;

evacuating said deposition chamber to a sub-atmospheric pressure;

introducing into said evacuated deposition chamber a background gas including a partial pressure of at least hydrogen; and successively laser ablation depositing silicon and germanium from said at least one target and hydrogen from the background pressure onto said substrate; thereby forming on said substrate a plurality of layer pairs of hydrogenated amorphous germanium and amorphous silicon alloy material, each layer of said layer pair being about 5-30 Å thick, each germanium and silicon layer of said layer of said pair characterized by the substantial absence of germanium hydrides and silicon hydrides, other than the monohydrides, respectively, a mobility-lifetime product for nonequilibrium charge carriers therein of about $10^{-8}$ and $10^{-7}$ cm$^2$/V, respectively, and a density of defect states in the host matrix thereof of about $1 \times 10^{17}$/cm$^3$ and $2 \times 10^{16}$/cm$^3$, respectively.

40. The method of claim 39 including the further step of forming a portion of said at least one target of crystalline germanium and silicon material.

41. The method of claim 39 including the further step of incorporating one or more p or n dopant elements in the target.

42. The method of claim 39 including the further step of forming each layer of said layer pairs of hydrogenated amorphous germanium alloy material and hydrogenated amorphous silicon alloy material so as to have reduced porosity as compared with plasma CVD deposited hydrogenated germanium or hydrogenated silicon alloy material.

43. The method of claim 39 including the further step of forming each layer of said layer pairs of hydrogenated amorphous germanium alloy material and hydrogenated amorphous silicon alloy material so as to have a reduced sensitivity to photoinduced Stabler/Wronski degradation over time as compared with plasma CVD deposited hydrogenated germanium or hydrogenated silicon alloy material.

44. The method of claim 39 wherein said step of evacuating said deposition chamber to a sub-atmospheric pressure comprises evacuating said deposition chamber to a pressure of about $10^{-5}$ Torr or less.

45. The method of claim 39 wherein said step of introducing said background gas comprises introducing said background gas at a pressure of about 30 to about 1000 m Torr.

46. The method of claim 39 including the further step of including one or more additional components in said background pressure, said additional components being selected from the group consisting of silane, germane, methane, acetylene, silicon tetrafluoride, germanium tetrafluoride, carbon tetrafluoride, flourine, phosphine, borane, diborane, and mixtures thereof.

47. The method of claim 39 including the further step of heating said substrate before depositing said layers of hydrogenated amorphous germanium alloy material and hydrogenated amorphous silicon alloy material.

48. The method of claim 47 wherein said step of heating said substrate comprises heating said substrate to a temperature of up to 250° C.

49. The method of claim 39 including the further step of laser ablation depositing each of said layers of said layer pairs of hydrogenated amorphous germanium alloy material and hydrogenated amorphous silicon alloy material at a laser power of about 3 to about 6 Joules/cm$^2$.

50. The method of claim 39 including the further step of laser ablation depositing each of said layer pairs at a laser pulse rate of about 1 to about 50 Hz.

51. The method of claim 39 including the further step of laser ablation depositing each of said layer pairs at a deposition rate of about 1 to about 5 Å/pulse.

52. The method of claim 39 including the further step of controlling laser power and wavelength during said laser ablation deposition process such that free radicals are formed in said deposition chamber.

53. The method of claim 39 including the further step of providing a plasma in said deposition chamber to dissociate gaseous precursors introduced into said background gas into free radical forms thereof.

54. The method of claim 53 including the further step of providing a microwave plasma in said deposition chamber during said laser ablation depositing step.

55. The method of claim 53 including the further step of providing a radio frequency plasma in said deposition chamber during said laser ablation depositing step.

56. The method of claim 39 including the further step of introducing a partial pressure of fluorine-containing gas into the deposition chamber, whereby each layer of the layer pairs will incorporate into the host matrix thereof a substantial atomic percentage of fluorine so as to create more stable bonding configurations which are less sensitive to photoinduced degradation.

57. The method of claim 56 wherein about 3 to about 7 atomic percent of fluorine is incorporated into each layer of the layer pairs.

58. The method of claim 39 wherein each interface formed between each germanium layer of each layer pair and each silicon layer of each layer pair is discrete.

59. The method of claim 39 wherein two targets are provided, one of said targets including germanium material and the second of said targets including silicon material.

60. The method of claim 39 wherein a single target is provided and the target includes regions of germanium material and regions of silicon material.

* * * * *

UNITED STATES PATENT AND TRADEMARK OFFICE
CERTIFICATE OF CORRECTION

PATENT NO. : 5,231,047
DATED : July 27, 1993
INVENTOR(S) : Stanford R. Ovshinsky, et al.

It is certified that error appears in the above-indentified patent and that said Letters Patent is hereby corrected as shown below:

On the Title Page, item [54] and column 1, line 4, delete "FABRICATION" and insert --FABRICATING--.

On Column 13, line 1, delete "protons/cm$^2$", and insert --photons/cm$^2$--

On Column 23, line 29, after "said layer", delete "of said".

Signed and Sealed this

Twenty-eight Day of February, 1995

Attest:

BRUCE LEHMAN

Attesting Officer     Commissioner of Patents and Trademarks